(12) United States Patent
Yuan

(10) Patent No.: US 6,624,091 B2
(45) Date of Patent: Sep. 23, 2003

(54) METHODS OF FORMING GAP FILL AND LAYERS FORMED THEREBY

(75) Inventor: Zheng Yuan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/851,201

(22) Filed: May 7, 2001

(65) Prior Publication Data

US 2002/0163028 A1 Nov. 7, 2002

(51) Int. Cl.⁷ .................. H01L 21/31; H01L 21/469
(52) U.S. Cl. .............. 438/778; 438/787; 427/255.27
(58) Field of Search ................. 438/787, 788, 438/789, 773, 778; 427/585, 255.18, 255.27

(56) References Cited

U.S. PATENT DOCUMENTS

| 4,949,671 | A | | 8/1990 | Davis et al. | |
|---|---|---|---|---|---|
| 5,763,018 | A | * | 6/1998 | Sato | 427/535 |
| 5,874,367 | A | * | 2/1999 | Dobson | 438/787 |
| 6,030,460 | A | | 2/2000 | Sukharev | |
| 6,054,379 | A | | 4/2000 | Yau et al. | 438/623 |
| 6,068,884 | A | | 5/2000 | Rose et al. | 427/255.6 |
| 6,072,227 | A | | 6/2000 | Yau et al. | 257/642 |
| 6,194,304 | B1 | | 2/2001 | Morozumi et al. | |

FOREIGN PATENT DOCUMENTS

EP  1 063 692 A1  12/2000

OTHER PUBLICATIONS

Gaillard, F. et al. entitled *"Hydrogen Peroxide and Silane CVD Process for Pre Metal Device Applications,"* Feb. 20–21, 1996, DUMIC Conference 1996 ISMIC—111D/96/0124, pp. 124–131.

* cited by examiner

*Primary Examiner*—Alexander Ghyka
(74) *Attorney, Agent, or Firm*—Townsend and Townsend and Crew

(57) ABSTRACT

A method of forming a fill layer over a layer in a semiconductor stack having gaps of high aspect ratio topography, and products produced thereby.

10 Claims, 3 Drawing Sheets

METHODS OF FORMING GAP FILL AND LAYERS FORMED THEREBY

FIELD OF THE INVENTION

The field of the present invention pertains to the deposition of gap fill materials over interconnect structures to fill in discontinuous or nonconforming topologies, methods of forming and depositing gap fill layers, and gap fill layers and semiconductor devices resulting therefrom.

BACKGROUND OF THE INVENTION

As integrated circuits (IC's) become more compact, dense and powerful, this necessarily also has decreased and continues to decrease the distances between adjacent components and interconnects. Due to this increasing density and the need for faster speeds, copper and copper alloys are again receiving attention as materials of choice for interconnects. Copper offers advantages over aluminum in that it has a lower resistivity than aluminum and exhibits superior electromigration properties.

Whether using copper or aluminum, the topography of stacks is becoming more dense and intricate. For example, a typical capacitor stack configuration has tended toward larger and larger aspect ratios to achieve greater surface area of the capacitor plates, thereby increasing the overall capacitance of the stack. These high aspect ratio formations are but one example of the increasing need for the ability to deposit a layer over steep, multi step formations, while achieving a smooth, flat and thickness consistent layer.

Many gap fill layers lack an adequate ability to flow so as to consistently cover high aspect ratio gaps and other step formations, resulting in unacceptable coverage, e.g., smaller gaps may still remain between the gap fill layer and the structure intended to be covered. For example, FIG. 2 shows a prior art layer 90 lacking adequate flow characteristics to completely conform to the topography of the stepped stack that it is applied over. The lack of flowability translates to a lack of conformability, with a greater buildup of the layer on the tops of the interconnects 92 forming areas of increased thickness 100. Also, the areas overlying the gaps are depressed so that the resulting topography of the layer 90 is not flat on top or conforming to the underlying topography. As for the gaps, the lack of flowability of the layer 90 causes it to leave gaps 98, which, although smaller than the gaps prior to adding the filling layer 90, are detrimental to the functioning and/or performance of the finished semiconductor product. Although FIG. 2 shows an example of a conventional stack in which aluminum interconnects 92 are deposited on a dielectric layer 94 overlying a substrate 96, it is noted that the same type of filling problems arise in stacks produced according to damascene and dual damascene techniques using copper, i.e., uneven filling layer thicknesses, lack of flatness of the filling layer, voids in the trenches and/or vias.

Additionally, when aspect ratios (i.e., height to width ratio of a gap) of the gaps are greater than those shown in FIG. 2, e.g., greater than about 2:1 and currently up to about 10:1, voids 102 can be left in the gaps as a result of the inability of the layer 90 to even reach the bottom of the gaps, as shown in FIG. 4. Again, this problem occurs with both conventional techniques as well as with damascene and dual damascene techniques employed with copper.

Attempts have been made to improve the flowability of fill layers by the formation of a dielectric layer produced by providing an organic silane layer, e.g., TEOS, in gas form and converting it to an oxide film by various CVD processes. In one example, a plasma enhanced CVD process uses an organic silane as a starting gas, and water is added to it to increase the surface wettability of the interface between the layer formed and the substrate on which the layer is formed. Thus, the dielectric layer formed is more likely to flow and result in a flatter surface of the finished layer, while also flowing together to prevent leaving voids. Although this method has low dependence on the shape of the substrate as to its flowability, the concentration of hydroxyl groups in the resulting layer is relatively high, and this causes a lower film quality.

A method of forming a dielectric fill layer has also been proposed in which the layer is produced by feeding an organic silane such as TEOS, and $H_2O_2$ into a CVD processing chamber, which react to form the oxide layer, see F. Gallard et al., "*Hydrogen Peroxide and Silane CVD Process for Pre Metal Device Applications*" 1996 Proceedings Dielectrics for VLSI/ULSI Multilevel Interconnection Conference, February 20–21, Santa Clara, Va. The surface to which the dielectric layer is applied is wetted due to the water that is produced as a reaction product of the $H_2O_2$ reacting with the organic silane Also, the highest concentration of $H_2O_2$ that is commercially available is 60%, with the remainder being water. Thus, water is also taken up into the film causing the film quality to degrade. Also, since $H_2O_2$ is highly reactive, it is difficult to control its reactivity and it may prematurely react, at least in part, with the silane above the actual location in which the film is desired to be produced.

Another method of forming a dielectric layer is disclosed in U.S. Pat. No. 5,763,018, in which a plasma enhanced CVD process is used to deposit water molecules and plasma-dissociated products of water molecules on a substrate where a dielectric layer is intended to be formed. The dielectric layer is then formed by injecting a silicon containing gas, e.g., TEOS, and an oxidant, e.g., ozone, which react to form an oxide layer on the substrate. This process also runs the risk of prematurely reacting at least some of the TEOS with the oxidant and water vapor, either above the substrate surface or even in the feed pipe, since TEOS oxidant and water vapor are fed into the chamber together through a single input.

Thus, there remains a need for a reliable, conformable, flowable gap filling dielectric layer and method for reliably producing the same in a cost effective manner with adequate throughput.

SUMMARY OF THE INVENTION

An embodiment of the present invention provides a method of forming a dielectric layer on a substrate with improved gap filling results, by co-injecting an oxidant and water vapor into a deposition chamber, and injecting a silicon-containing gas or vapor into the deposition chamber, wherein the silicon-containing gas or vapor reacts with the oxidant in the deposition chamber according to a normal temperature process (e.g. from about room temperature to about 200° C.) to deposit a layer onto the substrate.

An oxidant such as ozone may be used, wherein the ozone and the water vapor are heated in a showerhead to decompose the ozone prior to co-injecting the materials into the deposition chamber.

The showerhead is heated to a temperature up to about 200 C., typically about 90 C. to about 120 C.

The co-injecting is accomplished through first channels in a showerhead. The first channels are separate from second channels in the showerhead. The silicon-containing gas or vapor is injected through the second channels.

At least portions of the co-injecting and injecting steps may be performed simultaneously.

A capacitor stack configuration is disclosed which includes a substrate; a dielectric film having been deposited on an upper surface of the substrate; metallic interconnects having been deposited on the dielectric film and extending therefrom, and a gap fill layer. The metallic interconnects forming high aspect ratio gaps therebetween, wherein a depth of the high aspect ratio gaps is greater than a width of the high aspect ratio gaps. The dielectric fill layer is deposited over the metallic interconnects and gaps, to substantially fills the high aspect ratio gaps without leaving voids.

The dielectric fill layer is deposited by positioning the substrate, dielectric film and metallic interconnects into a deposition chamber; co-injecting an oxidant and water vapor into the deposition chamber; and injecting a silicon-containing gas or vapor into the deposition chamber; wherein the silicon-containing gas or vapor reacts with the oxidant in the deposition chamber according to a normal temperature process (e.g., including temperatures of about room temperature up to about 200° C.) to deposit the dielectric fill layer.

The high aspect ratio gaps have an aspect ratio from about 7:1 to about 10:1, for example.

The dielectric fill layer comprises an oxide film containing a large number, e.g., up to about 50% of the available sites on the silicon atoms, of silanol groups within a silicon oxide network.

Other semiconductor structures than capacitors can also benefit from the gap filling layer of the present invention and method of producing the same.

DETAILED DESCRIPTION OF PREFERRED EMBODIMENTS

Figure 1:
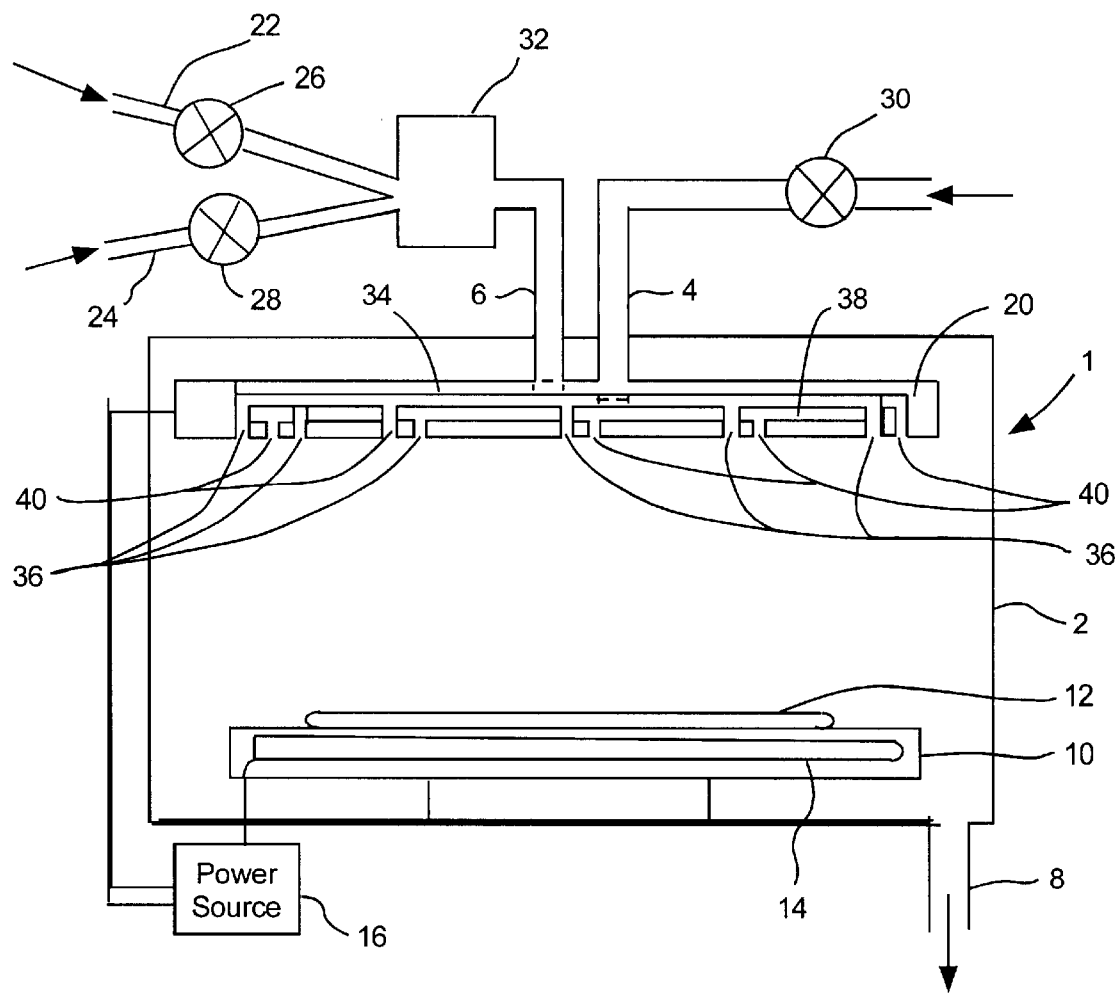
FIG. 1 is a schematic representation of a CVD apparatus used in forming fill layers according to the present invention.

Before the present methods, fill layers, and dielectric stacks are described, it is to be understood that this invention is not limited to particular methodologies, materials and substrates and can, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that as used herein and in the appended claims, the singular forms "a", "and", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

DEFINITIONS

The term "dielectric" as used herein refers to a material in which an electric field can be maintained with zero or near-zero power dissipation, i.e., the electrical conductivity is zero or near zero.

The term "fill layer" as used herein refers to a dielectric layer that is applied over a gapped, uneven or stepped configuration of a buildup of layers, or stack, in a semiconductor configuration.

The term "integrated circuit" as used herein refers to an electronic circuit having multiple individual circuit elements, such as transistors, diodes, resistors, capacitors, inductors, and other active and passive semiconductor devices, formed on a single chip of semiconducting material and mounted on a single piece of substrate material.

The following abbreviations are used throughout the specification:

CVD is used for chemical vapor deposition.

TEOS is used for tetraethoxysilane or tetraethylorthosilicate.

Turning now to FIG. 1, a schematic representation of a CVD apparatus 1 used in forming fill layers according to the present invention is shown. The apparatus 1 includes a processing chamber 2 with gas input lines 4 and 6 and an evacuation line 8 which is connected to a vacuum source (not shown) capable of maintaining the interior of the chamber 2 at a predetermined pressure level.

A susceptor 10 is mounted at the bottom of the chamber 2 and is configured to support a wafer 12 thereon. The susceptor 10 may have an electrically resistive heating element 14 embedded therein, which is electrically connected to a power source 16 capable of supplying electrical power to the resistive element 14 so as to maintain the susceptor (and hence the wafer) at a predetermined processing temperature. The susceptor 10 may be made of aluminum, stainless steel, ceramic or other material currently used in the art.

A shower head 20 is provided in the top portion of the chamber 2 and is configured to inject the reactive components into the chamber to be processed according to the desired reaction. A silicon-containing gas/vapor, e.g., $SiH_4$ is inputted from a silicon-containing gas source or reservoir (not shown) through input line 4 and into the shower head 20 to be injected into the chamber 2 therefrom. A throttle valve 30 or other means of controlling the flow rate of silicon-containing gas/vapor is provided in the input line 4. Separate input lines 22 and 24 are provided for independently inputting ozone and $H_2O$ vapor, respectively. Each line 22, 24 is provided with a throttle valve 26, 28, respectively, or other means of controlling the flow rates of the ozone and water vapor. The input lines 22 and 24 direct the ozone and water vapor to a direct liquid injection unit (such as one available from ASTEC, Wilmington, Mass., for example) or bubbler system 32 (such as one available from Schumacher, Santa Clara, Calif.) or other bubbler system as well known and used in the art), where the components are mixed to form wet ozone which is delivered to the shower head 20 via input line 6.

In the embodiment shown in FIG. 1, the shower head 20 is provided with independent manifolds 34 and 38. Manifold 34 connects with input line 6, distributes the wet ozone through the shower head 20 and injects the wet ozone into the chamber 2 through injection nozzles 36 (of course only representative nozzles 36 are shown for the sake of simplicity, there are actually very many more nozzles in number). Similarly, manifold 38 connects with input line 4, distributes the silicon-containing gas/vapor through the shower head 20 and injects the wet ozone into the chamber 2 through injection nozzles 36 (of course, only representative nozzles 36 are shown for the sake of simplicity, there are actually there are actually very many more nozzles in number). In this way, absolutely no mixing of the silicon-containing gas/vapor with the wet ozone can occur prior to the entry of each into the reaction chamber. This completely eliminates any risk of premature reaction of the silicon-containing gas/vapor with the wet ozone.

An electrically resistive heating element (not shown) or other heating means may be provided in the shower head 20 and connected to a power source 16 (or a power source independent of that connected to the susceptor 14), in order to heat the precursor materials (i.e., silicon-containing gas/vapor and wet ozone) to a predetermined temperature to enhance the reaction time upon injection into the reaction chamber 2. For example, the shower head may be controlled to heat the precursor materials from an entry temperature at room temperature up to a temperature up to about 200 C., typically about 80 C. to about 120 C., prior to injecting the materials into the reaction chamber.

Because the ozone and $H_2O$ sources are independently fed to the bubbler/injector 32, and because a throttle valve/flow control mechanism 26, 28 is provided for each line, the concentration of ozone as well as the concentration of $H_2O$ vapor can be individually controlled and varied, even in situ, during processing. Also, since the silicon-containing gas/vapor is fed through an independent channel and is also flow controlled by a throttle valve/flow control mechanism 30, its relative concentration can be varied, even while the process is proceeding. This also gives the options of varying the timing during which the silicon-containing gas is delivered, versus when the water and ozone are delivered. Both may be delivered simultaneously for the same periods of time, sequentially, or with overlapping injection times. Virtually any injection timing scheme can be controlled, and although not all schemes would produce desirable results, it is this versatility that allows the process to be tuned to produce the best results. Example flow rates are in the range of 20–100 sccm, preferably about 60 sccm for $SiH_4$, about 60–200 sccm for the flow rate of $H_2O$, and about 60–1000 sccm for the flow rate of $O_3$. Thus, the chemical delivery for forming the fill layer is much more versatile and controllable than in the prior art, and can be adjusted to achieve optimal properties for the application at hand. Upon injection of the precursor materials into the reaction chamber 2, the silicon-containing precursor gas/vapor is hydrolyzed on the substrate surface (i.e., top surface of wafer 12) to form an oxide film containing a large number (about 40–50% of the possible sites filled) of silanol groups within a silicon oxide network. After completion of the film formation, and disclosure of the input lines, reactions remaining in the chamber are exhausted through exhaust port 8. This film exhibits very favorable flow properties for coverage of step patterns on structural wafers, which leads to void-free gap filling, as represented by the film coverage shown in FIGS. 3 and 5.

Figure 2:
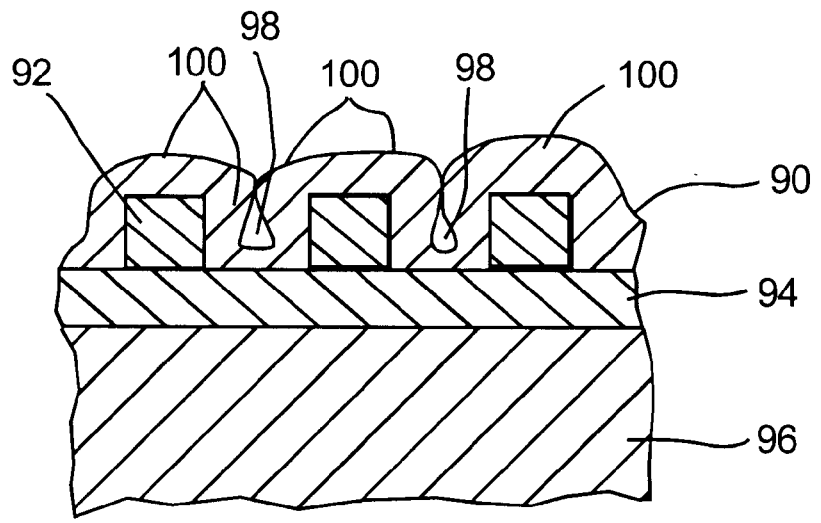
FIG. 2 is a schematic, sectional partial representation of a stack having a prior art dielectric fill layer formed thereover.
Figure 3:
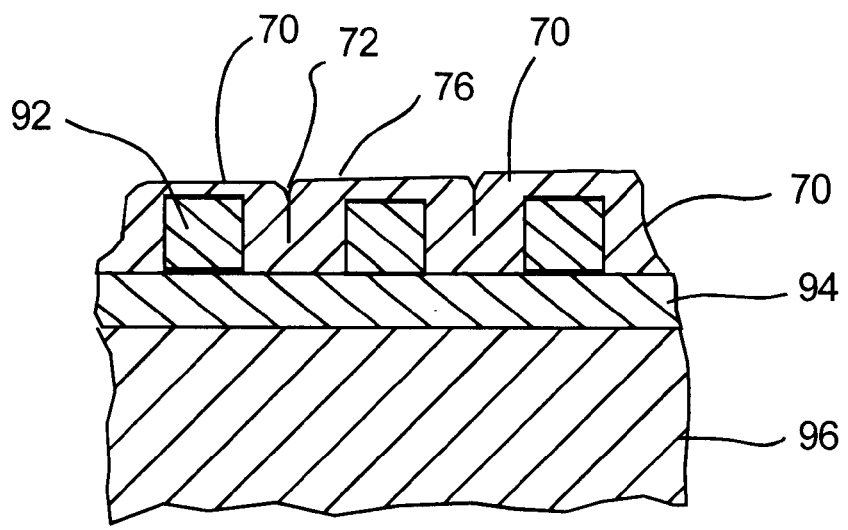
FIG. 3 is a schematic, sectional partial representation of a stack, similar to FIG. 2, but with a fill layer according to the present invention deposited thereover.

FIG. 3 shows coverage by a film 70, produced according to a method of the present invention, over a substrate identical to that shown as being inadequately filled by a prior art film in FIG. 2. In FIG. 3, it can be seen that the high percentage silanol film 70 of the present invention flows well upon application such that the coverage is quite even and leaves a relatively flat top surface 76. Also, in the gaps or channels, the film 70 flows so as to prevent any gaps being left open at the interface 72, as opposed to the gaps 98 left in the prior art example of FIG. 2.

Figure 4:
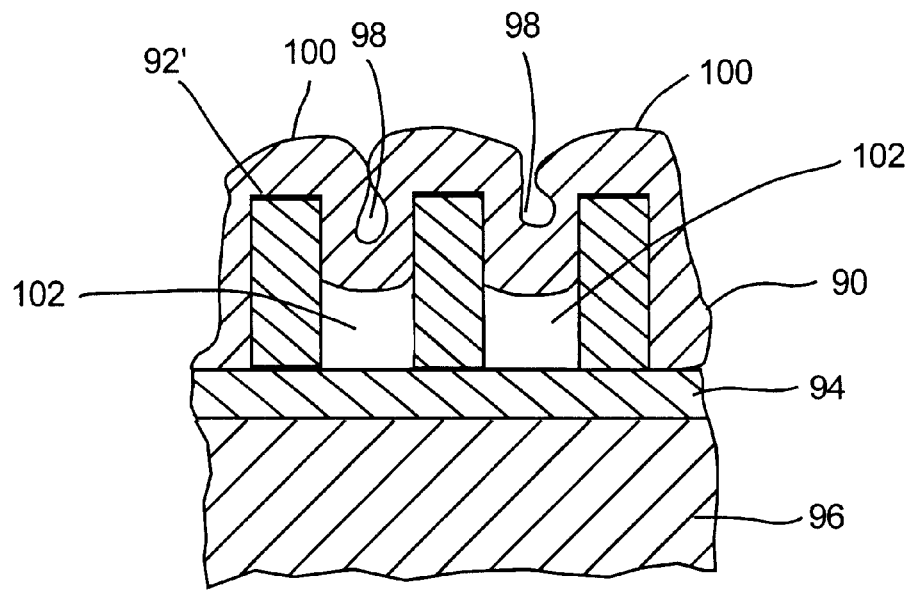
FIG. 4 is a schematic, sectional partial representation of a stack having gaps with relatively high aspect ratios, and a prior art dielectric fill layer formed thereover.
Figure 5:
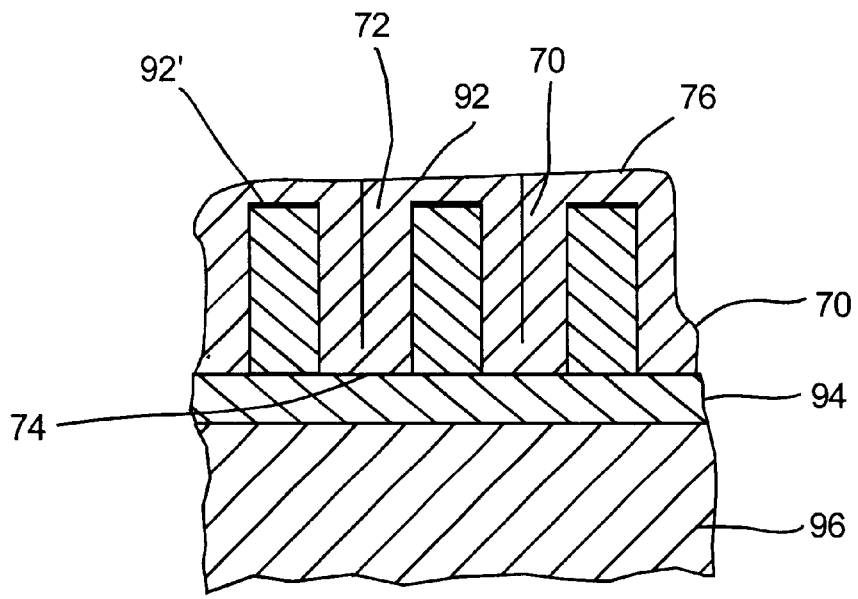
FIG. 5 is a schematic, sectional partial representation of a stack, similar to FIG. 4, but with a fill layer according to the present invention deposited thereover.

FIG. 5 shows coverage by a film 70, produced according to a method of the present invention, over a substrate identical to that shown as being inadequately filled by a prior art film in FIG. 4. In FIG. 5, it can be seen that the high percentage silanol film 70 of the present invention flows well upon application such that the coverage is quite even and leaves a relatively flat top surface 76. Also, in the gaps or channels, the film 70 flows so as to prevent any gaps being left open at the interface 72, as opposed to the gaps 98 left in the prior art example of FIG. 2. Additionally, it can be seen that the superb flow characteristics of the film 70 permit gap filling all the way to the bottom of even a high aspect ratio gap or channel, as opposed to leaving voids 102 at the bottom of the channels, as in the prior art shown in FIG. 4.

An prophetic example procedure for the formation of a film 70 according to the present invention follows. After placing a substrate 12 on the susceptor 10, the reaction chamber 2 will be sealed and evacuated to a pressure of 0.5 to 10 Torr.

Water will next be directly injected at a flow rate of about 120 sccm and ozone will be introduced at a flow rate of about 180–300 sccm. At about the same time, $SiH_4$ vapor will be inputted to the shower head 20 at a flow rate of about 60 sccm. Upon reaching the shower head, the precursor materials will be heated to a temperature of about 120 C. and then injected through nozzles 36 and 40 respectively, into the reaction chamber to react the $SiH_4$ with the wet ozone and deposit a film onto the substrate at a rate of up to 5000. The length of the preceding procedures will be determined by the actual deposition rate and the desired final thickness of the layer being deposited.

Upon reaching the desired film thickness, the flows will be shut down, the reaction chamber purged, and the substrate will then be removed from the chamber.

While the present invention has been described with reference to the specific embodiments thereof, it should be understood by those skilled in the art that various changes may be made and equivalents may be substituted without departing from the true spirit and scope of the invention. For example, although the processing is described above with regard to via first etching, it is noted that the present invention applies equally to trench-first process as well as other damascene techniques. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of forming a dielectric layer on a substrate comprising:

independently co-injecting an oxidant and water vapor into a deposition chamber; and injecting a silicon-containing gas or vapor into the deposition chamber;

wherein the silicon-containing gas or vapor reacts with the oxidant in the deposition chamber to deposit a layer onto the substrate.

2. The method of claim 1 wherein the oxidant comprises ozone.

3. The method of claim 2 further comprising heating the ozone and water vapor in a showerhead to decompose the ozone prior to said co-injecting into the deposition chamber.

4. The method of claim 1 wherein said co-injecting is through first channels in a showerhead which are separate from second channels in the showerhead through which said injecting a silicon-containing gas or vapor is performed.

5. The method of claim 1 wherein at least portions of said co-injecting and said injecting are performed simultaneously.

6. The method of claim 3 wherein the showerhead is heated to about 90° C. to 120° C.

7. A method of forming a dielectric layer on a substrate comprising:

co-injecting ozone and water vapor through first channels in a showerhead and into a deposition chamber; and injecting silane gas or vapor through second channels in the showerhead which are separate from the first channels, and into the deposition chamber;

wherein the silicon-containing gas or vapor reacts with the oxidant in the deposition chamber to deposit a layer onto the substrate.

8. A method of forming a dielectric layer on a substrate comprising:

co-injecting separate sources of an oxidant and water vapor into a deposition chamber; and injecting a silicon-containing gas or vapor into the deposition chamber; and reacting the silicon-containing gas or vapor with the oxidant to form the dielectric layer.

9. The method of claim 1 wherein the deposition process occurs at a temperature ranging from about room temperature to about 200° C.

10. The method of claim 9 wherein the deposition occurs according to a normal temperature process.

* * * * *